United States Patent
Yonezawa et al.

(10) Patent No.: US 12,354,837 B2
(45) Date of Patent: Jul. 8, 2025

(54) PLASMA PROCESSING METHOD AND PLASMA PROCESSING APPARATUS

(71) Applicant: Tokyo Electron Limited, Tokyo (JP)

(72) Inventors: Takahiro Yonezawa, Miyagi (JP); Takayuki Katsunuma, Miyagi (JP); Shinya Ishikawa, Miyagi (JP); Koki Tanaka, Miyagi (JP); Sho Kumakura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 97 days.

(21) Appl. No.: 18/115,137

(22) Filed: Feb. 28, 2023

(65) Prior Publication Data

US 2023/0282447 A1 Sep. 7, 2023

(30) Foreign Application Priority Data

Mar. 1, 2022 (JP) ................................. 2022-031131
Feb. 6, 2023 (JP) ................................. 2023-016096

(51) Int. Cl.
*H01J 37/32* (2006.01)

(52) U.S. Cl.
CPC ..... *H01J 37/3211* (2013.01); *H01J 37/32091* (2013.01); *H01J 37/32119* (2013.01); *H01J 37/32183* (2013.01); *H01J 2237/3342* (2013.01); *H01J 2237/3348* (2013.01)

(58) Field of Classification Search
CPC ............. H01J 37/3211; H01J 37/32091; H01J 37/32119; H01J 37/32183; H01J 2237/3342; H01J 2237/3348
See application file for complete search history.

(56) References Cited

U.S. PATENT DOCUMENTS

| | | | |
|---|---|---|---|
| 9,685,297 B2* | 6/2017 | Carter | H01J 37/08 |
| 10,950,454 B2* | 3/2021 | Zhou | H01J 37/32917 |
| 11,257,678 B2* | 2/2022 | Takamatsu | H01L 21/3065 |
| 2015/0104950 A1* | 4/2015 | Mikami | H01L 21/02071 438/714 |
| 2015/0255305 A1* | 9/2015 | Nakagawa | H01J 37/32027 156/345.28 |
| 2019/0006186 A1* | 1/2019 | Sato | H01L 21/67248 |
| 2020/0227289 A1* | 7/2020 | Song | H01L 21/67069 |
| 2021/0384030 A1* | 12/2021 | Blanquart | C23C 16/505 |

FOREIGN PATENT DOCUMENTS

JP 2016-039309 A 3/2016

* cited by examiner

*Primary Examiner* — Tung X Le
(74) *Attorney, Agent, or Firm* — XSENSUS LLP

(57) ABSTRACT

A plasma processing method includes: providing a substrate including a silicon-containing film and a mask film having an opening pattern, on a substrate support; and etching the silicon-containing film using the mask film as a mask, with a plasma generated by a plasma generator provided in the chamber. The etching includes: supplying a processing gas containing one or more gases including carbon, hydrogen, and fluorine into the chamber; generating a plasma from the processing gas by supplying a source RF signal to the plasma generator; and supplying a bias RF signal to the substrate support unit. In the etching, the silicon-containing film is etched by at least hydrogen fluoride generated from the processing gas, while forming a carbon-containing film on at least a part of a surface of the mask film.

18 Claims, 10 Drawing Sheets

|  | REFERENCE EXAMPLE 1 | EXAMPLE 1 | EXAMPLE 2 |
|---|---|---|---|
| CD (nm) | 23.1 | 23.2 | 21.8 |
| LCDU (nm) | 2.5 | 1.8 | 1.4 |
| LCDU/AVERAGE CD (%) | 10.6 | 7.7 | 6.4 |
| CER (nm) | 2.1 | 1.9 | 1.9 |

FIG. 12

|  | REFERENCE EXAMPLE 2 | EXAMPLE 3 |
|---|---|---|
| ETCHING RATE (nm/min) | 44.9 | 75.5 |
| SELECTION RATIO | 5.5 | 2.5 |
| NECK CD (nm) | 18.3 | 18.8 |
| BOW CD (nm) | 20.3 | 19.7 |

PLASMA PROCESSING METHOD AND PLASMA PROCESSING APPARATUS

CROSS-REFERENCE TO RELATED APPLICATIONS

This application is based on and claims priority from Japanese Patent Application Nos. 2022-031131 and 2023-016096, filed on Mar. 1, 2022 and Feb. 6, 2023, respectively, with the Japan Patent Office, the disclosures of which are incorporated herein in their entireties by reference.

TECHNICAL FIELD

Embodiments of the present disclosure relate to a plasma processing method and a plasma processing apparatus.

BACKGROUND

A plasma etching of a silicon-containing film on a substrate is performed in the manufacture of an electronic device. For example, Japanese Patent Laid-Open No. 2016-039309 discloses a method for etching a dielectric film by plasma etching.

SUMMARY

In an embodiment of the present disclosure, a plasma processing method performed in a plasma processing apparatus is disclosed. The plasma processing apparatus includes a chamber, a substrate support disposed in the chamber, and a plasma generator disposed to face the substrate support. The plasma processing method includes: preparing a substrate including a silicon-containing film and a mask film having an opening pattern, on the substrate support; and etching the silicon-containing film using the mask film as a mask, with a plasma generated in the chamber. The etching includes: supplying a processing gas containing one or more gases including carbon, hydrogen, and fluorine into the chamber: generating a plasma from the processing gas by supplying a source RF signal to the plasma generator; and supplying a bias RF signal to the substrate support. In the etching, the silicon-containing film is etched by at least hydrogen fluoride generated from the processing gas, while forming a carbon-containing film on at least a part of a surface of the mask film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 12 is a table illustrating measurement results of Reference Example 2 and Example 3.

DETAILED DESCRIPTION

Figure 1:
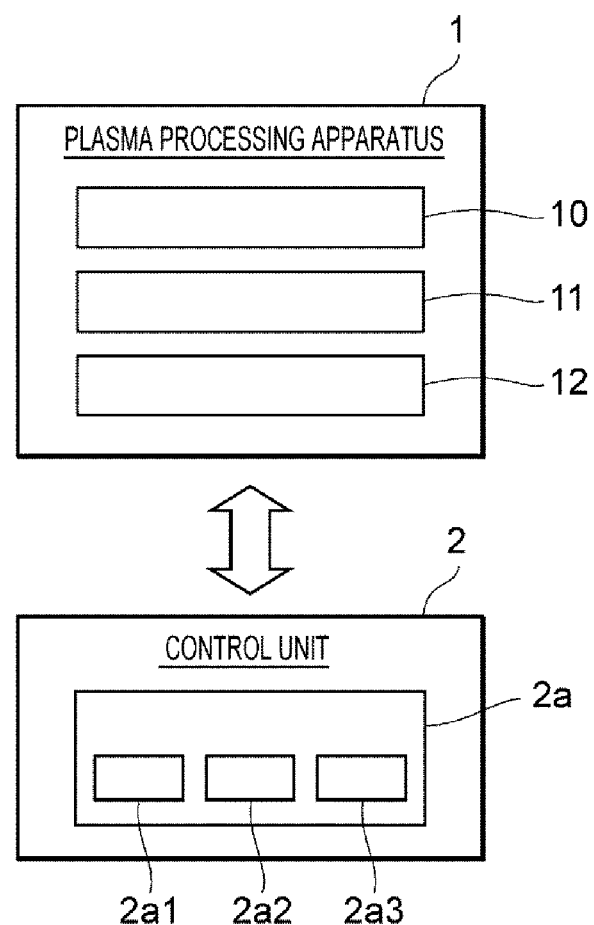
FIG. 1 is a view illustrating an example of a configuration of a plasma processing system.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, each embodiment of the present disclosure will be described.

In one embodiment, a plasma processing method performed in a plasma processing apparatus is provided. The plasma processing apparatus includes a chamber, a substrate support disposed in the chamber, and a plasma generator disposed to face the substrate support. The plasma processing method includes: preparing a substrate including a silicon-containing film and a mask film having an opening pattern, on the substrate support; and etching the silicon-containing film using the mask film as a mask, with a plasma generated in the chamber. The etching includes: supplying a processing gas containing one or more gases including carbon, hydrogen, and fluorine into the chamber: generating a plasma from the processing gas by supplying a source RF signal to the plasma generator; and supplying a bias RF signal to the substrate support. In the etching, the silicon-containing film is etched by at least hydrogen fluoride generated from the processing gas, while forming a carbon-containing film on at least a part of a surface of the mask film.

In the embodiment, the plasma processing apparatus is a capacitively coupled plasma processing apparatus using the plasma generator and the substrate support as electrodes.

In the embodiment, the plasma processing apparatus is an inductively coupled plasma processing apparatus.

In the embodiment, the plasma generator includes an antenna disposed to face the substrate support. The chamber includes a side wall, and a dielectric window disposed between the substrate support and the antenna. The plasma processing apparatus includes a first gas injector disposed in the dielectric window, and a second gas injector disposed in the side wall. In the etching, the processing gas is supplied from the first gas injector and the second gas injector into the chamber.

In the embodiment, the processing gas contains a nitrogen-containing gas.

In the embodiment, the nitrogen-containing gas is nitrogen gas ($N_2$) or nitrogen trifluoride ($NF_3$).

In the embodiment, in the processing gas, a ratio of a number of hydrogen atoms to a number of fluorine atoms is 0.2 or more.

In the embodiment, in the etching, a pressure in the chamber is 50 mTorr or less.

In the embodiment, a power of the source RF signal is larger than a power of the bias signal.

In the embodiment, a ratio of the power of the source RF signal to the power of the bias signal is 10 or more.

In the embodiment, the preparing further includes: forming an EUV resist on the silicon-containing film; forming the mask film having the opening pattern by exposing the EUV resist; and disposing the substrate on which the mask film is formed on the substrate support.

In the embodiment, the EUV resist is an organic film resist.

In the embodiment, the EUV resist is a metal-containing film resist.

In the embodiment, the metal-containing film resist is a tin (Sn)-containing film resist.

In the embodiment, the power of the source RF signal is 500 W or more.

In the embodiment, the power of the bias signal is 200 W or less.

In the embodiment, the mask film is a carbon-containing film or a metal-containing film.

In the embodiment, the power of the source RF signal is 500 W or more.

In the embodiment, the power of the bias signal is 200 W or more.

In the embodiment, an opening width of an opening included in the opening pattern is 25 nm or less.

In the embodiment, a plasma processing apparatus is provided. The plasma processing apparatus includes: a chamber: a substrate support disposed in the chamber; a plasma generator provided to face the substrate support; and a controller. The controller performs: control of preparing of a substrate including a silicon-containing film and a mask film on the substrate support; and control of etching of the silicon-containing film using the mask film as a mask, with a plasma generated in the chamber. In the control of etching, control of supplying a processing gas containing one or more gases including carbon, hydrogen, and fluorine into the chamber; control of generating a plasma from the processing gas by supplying a source RF signal to the plasma generator; and control of supplying a bias signal to the substrate support are performed. In the control of etching, control of etching of the silicon-containing film by at least hydrogen fluoride generated from the processing gas while forming a carbon-containing film on at least a part of a surface of the mask film is performed.

Hereinafter, each embodiment of the present disclosure will be described with reference to the drawings. In each drawing, the same or similar elements are designated by the same reference numerals, and duplicate description will be omitted. Unless otherwise specified, the positional relationship such as up, down, left, and right will be described based on the positional relationship illustrated in the drawings. The dimensional ratio in the drawings does not indicate the actual ratio, and the actual ratio is not limited to the illustrated ratio.

Example of Plasma Processing System

FIG. 1 is a view illustrating an example of a configuration of a plasma processing system. In the embodiment, the plasma processing system includes a plasma processing apparatus 1 and a controller 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 includes a plasma processing space. Further, the plasma processing chamber 10 has at least one gas supply port that supplies at least one processing gas to the plasma processing space, and at least one gas discharge port that discharges a gas from the plasma processing space. The gas supply port is connected to a gas supply unit 20 (to be described later), and the gas discharge port is connected to an exhaust system 40 (to be described later). The substrate support 11 is disposed inside the plasma processing space, and includes a substrate support surface that supports a substrate.

The plasma generator 12 is configured to generate a plasma from at least one processing gas supplied into the plasma processing space. The plasma formed in the plasma processing space may be a capacitively coupled plasma (CCP), an inductively coupled plasma (ICP), an electron-cyclotron-resonance plasma (ECR), a helicon wave plasma (HWP), or a surface wave plasma (SWP). Further, various types of plasma generators including an alternating current (AC) plasma generator and a direct current (DC) plasma generator may be used. In the embodiment, an AC signal (AC power) used in the AC plasma generator has a frequency within a range of 100 kHz to 10 GHz. Therefore, the AC signal includes a radio frequency (RF) signal and a microwave signal. In the embodiment, the RF signal has a frequency within a range of 100 kHz to 150 MHz.

Example of CCP Plasma Processing Apparatus

Figure 2:
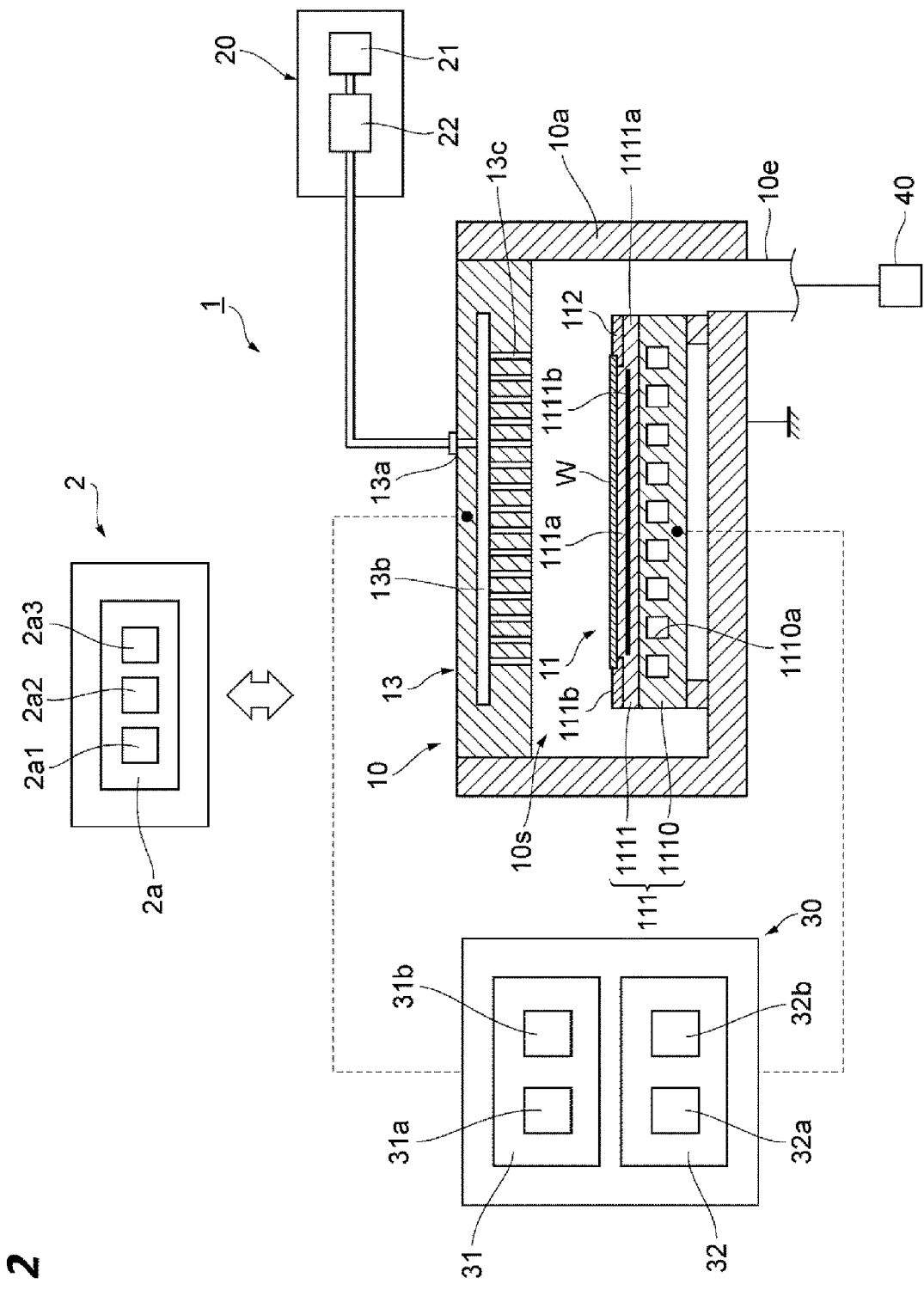
FIG. 2 is a view illustrating an example of a configuration of a capacitively coupled plasma processing apparatus.

FIG. 2 is a view illustrating an example of a configuration of a capacitively coupled plasma processing apparatus.

The plasma processing system includes a capacitively coupled plasma processing apparatus 1 and the controller 2. The capacitively coupled plasma processing apparatus 1 includes the plasma processing chamber 10, the gas supply unit 20, a power supply 30, and the exhaust system 40. Further, the plasma processing apparatus 1 includes the substrate support 11 and a gas introducing unit. The gas introducing unit is configured to introduce at least one processing gas into the plasma processing chamber 10. The gas introducing unit includes a shower head 13. The substrate support 11 is disposed inside the plasma processing chamber 10. The shower head 13 is disposed above the substrate support 11. In the embodiment, the shower head 13 constitutes at least a part of ceiling of the plasma processing chamber 10. The plasma processing chamber 10 includes a plasma processing space 10s defined by the shower head 13, a side wall 10a of the plasma processing chamber 10, and the substrate support 11. The plasma processing chamber 10 includes at least one gas supply port that supplies at least one processing gas to the plasma processing space 10s, and at least one gas discharge port that discharges the gas from the plasma processing space. The plasma processing chamber 10 is grounded. The shower head 13 and the substrate support 11 are electrically insulated from a housing of the plasma processing chamber 10.

The substrate support 11 includes a body portion 111 and a ring assembly 112. The body portion 111 includes a central region 111a that supports a substrate W, and an annular region 111b that supports the ring assembly 112. A wafer is an example of the substrate W. The annular region 111b of the body portion 111 surrounds the central region 111a of the body portion 111 viewed in plan view. The substrate W is disposed on the central region 111a of the body portion 111, and the ring assembly 112 is disposed on the annular region 111b of the body portion 111 so as to surround the substrate W on the central region 111a of the body portion 111. Therefore, the central region 111a is referred to as a substrate support surface that supports the substrate W as well, and the annular region 111b is referred to as a ring support surface that supports the ring assembly 112.

In the present embodiment, the body portion 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed inside the ceramic member 1111a. The ceramic member 1111a includes the central region 111a. In the embodiment, the ceramic member 1111a includes the annular region 111b as well. Another member surrounding the electrostatic chuck 1111, such as an annular electrostatic chuck or an annular insulating member, may include the annular region 111b. In this case, the ring assembly 112 may be disposed on either the annular electrostatic chuck or the annular insulating member, or both the electrostatic chuck 1111 and the annular insulating member. Further, at least one RF/DC electrode that is coupled to a radio frequency (RF) power supply 31 and/or a direct current (DC) power supply 32 (to be described later) may be disposed inside the ceramic member 1111a. In this case, at least one RF/DC electrode functions as a lower electrode. When a bias RF signal and/or DC signal (to be described later) are/is supplied to at least one RF/DC electrode, the RF/DC electrode is referred to as a bias electrode. The conductive member of the base 1110 and at least one RF/DC electrode may function as a plurality of lower electrodes. Further, the electrostatic electrode 1111b may function as a lower electrode. Therefore, the substrate support 11 includes at least one lower electrode.

The ring assembly 112 includes one or more annular members. In one embodiment, one or more annular members include one or more edge rings and at least one cover ring. The edge ring is made of a conductive material or an insulating material, and the cover ring is made of an insulating material.

Further, the substrate support 11 may include a temperature adjusting module configured to adjust at least one of the electrostatic chuck 1111, the ring assembly 112, and the substrate to a target temperature. The temperature adjusting module may include a heater, a heat transfer medium, a flow path 1110a, or a combination thereof. A heat transfer fluid such as brine or a gas flows through the flow path 1110a. In the embodiment, the flow path 1110a is formed inside the base 1110, and one or more heaters are disposed inside the ceramic member 1111a of the electrostatic chuck 1111. Further, the substrate support 11 may include a heat transfer gas supply unit configured to supply a heat transfer gas to a gap between a rear surface of the substrate W and the central region 111a.

The shower head 13 is configured to introduce at least one processing gas from the gas supply unit 20 into the plasma processing space 10s. The shower head 13 includes at least one gas supply port 13a, at least one gas diffusion chamber 13b, and a plurality of gas introducing ports 13c. The processing gas supplied to the gas supply port 13a passes through the gas diffusion chamber 13b and is introduced from the gas introducing ports 13c into the plasma processing space 10s. Further, the shower head 13 includes at least one upper electrode. In addition to the shower head 13, the gas introducing unit may include one or more side gas injectors (SGI) attached to one or more openings formed in the side wall 10a.

The gas supply unit 20 may include at least one gas source 21 and at least one flow rate controller 22. In the embodiment, the gas supply unit 20 is configured to supply at least one processing gas from the corresponding gas source 21 to the shower head 13 via the corresponding flow rate controller 22. Each flow rate controller 22 may include, for example, a mass flow controller or a pressure-control type flow rate controller. Further, the gas supply unit 20 may include one or more flow rate modulation devices that modulate or pulse the flow rate of at least one processing gas.

The power supply 30 includes a RF power supply 31 coupled to the plasma processing chamber 10 via at least one impedance matching circuit. The RF power supply 31 is configured to supply at least one RF signal (RF power) to at least one lower electrode and/or at least one upper electrode. Therefore, a plasma is formed from at least one processing gas supplied to the plasma processing space 10s. Therefore, the RF power supply 31 may function as at least a part of the plasma generator configured to generate a plasma from one or more processing gases in the plasma processing chamber 10. Further, by supplying the bias RF signal to at least one lower electrode, a bias potential is generated in the substrate W, and ion components in the formed plasma may be drawn into the substrate W.

In the embodiment, the RF power supply 31 includes a first RF generator 31a and a second RF generator 31b. The first RF generator 31a is configured to be coupled to at least one lower electrode and/or at least one upper electrode via at least one impedance matching circuit to generate the source RF signal (source RF power) for plasma generation. In the embodiment, the source RF signal has a frequency within a range of 10 MHz to 150 MHz. In the embodiment, the first RF generator 31a may be configured to generate a plurality of source RF signals having different frequencies. The generated one or more source RF signals are supplied to at least one lower electrode and/or at least one upper electrode.

The second RF generator 31b is configured to be coupled to at least one lower electrode via at least one impedance matching circuit to generate the bias RF signal (bias RF power). The frequency of the bias RF signal may be the same as or different from the frequency of the source RF signal. In the embodiment, the bias RF signal has a frequency lower than the frequency of the source RF signal. In the embodiment, the bias RF signal has a frequency within a range of 100 KHz to 60 MHz. In the embodiment, the second RF generator 31b may be configured to generate a plurality of bias RF signals having different frequencies. The generated one or more bias RF signals are supplied to at least one lower electrode. Further, in various embodiments, at least one of the source RF signal and the bias RF signal may be pulsed.

Further, the power supply 30 may include the DC power supply 32 coupled to the plasma processing chamber 10. The DC power supply 32 includes a first DC generator 32a and a second DC generator 32b. In the embodiment, the first DC generator 32a is configured to be connected to at least one lower electrode to generate a first DC signal. The generated first DC signal is applied to at least one lower electrode. In the embodiment, the second DC generator 32b is configured to be connected to at least one upper electrode to generate a second DC signal. The generated second DC signal is applied to at least one upper electrode. Hereinafter, the bias RF signal and bias DC signal may be collectively referred to as a "bias signal."

In various embodiments, at least one of the first and second DC signals may be pulsed. In this case, the sequence of the voltage pulse is applied to at least one lower electrode and/or at least one upper electrode. The voltage pulse may have a pulse waveform of rectangular, trapezoidal, triangular, or a combination thereof. In the embodiment, a waveform generator for generating the sequence of the voltage pulse from the DC signal is connected between the first DC generator 32a and at least one lower electrode. Therefore, the first DC generator 32a and the waveform generator constitute a voltage pulse generator. When the second DC generator 32b and the waveform generator constitute the voltage pulse generator, the voltage pulse generator is connected to at least one upper electrode. The voltage pulse may have a positive polarity or a negative polarity. Further, the sequence of the voltage pulse may have one or more positive voltage pulses and one or more negative voltage pulses in one cycle. The first and second DC generators 32a and 32b may be provided in addition to the RF power supply 31, or the first DC generator 32a may be provided instead of the second RF generator 31b.

The exhaust system 40 may be connected to, for example, a gas exhaust port 10e provided in a bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

Example of ICP Plasma Processing Apparatus

Figure 3:
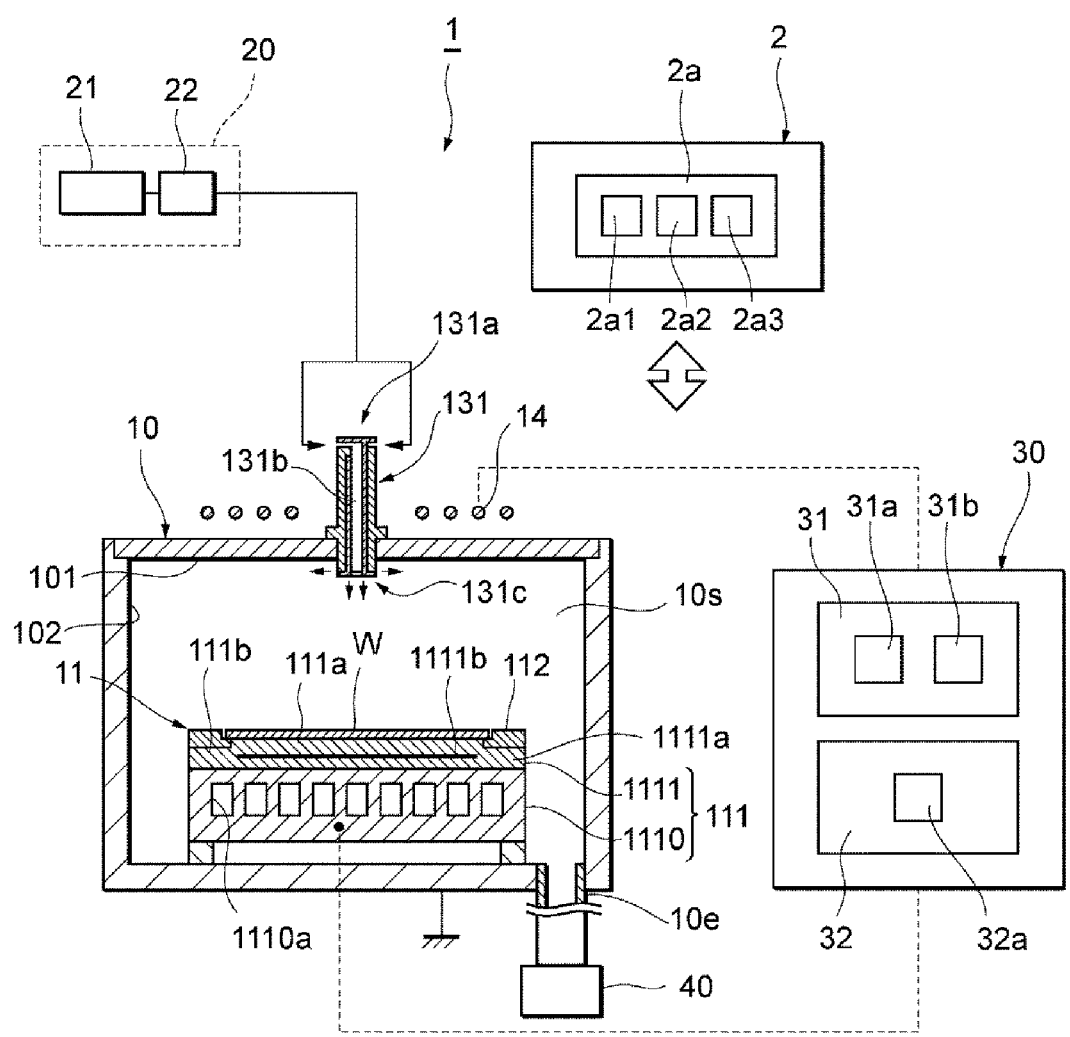
FIG. 3 is a view illustrating an example of a configuration of an inductively coupled plasma processing apparatus.

FIG. 3 is a view illustrating an example of a configuration of an inductively coupled plasma processing apparatus.

The plasma processing system includes an inductively coupled plasma processing apparatus 1 and the controller 2. The inductively coupled plasma processing apparatus 1 includes the plasma processing chamber 10, the gas supply unit 20, the power supply 30, and the exhaust system 40. The plasma processing chamber 10 includes a dielectric window. Further, the plasma processing apparatus 1 includes the substrate support 11, the gas introducing unit, and an antenna 14. The substrate support 11 is disposed inside the plasma processing chamber 10. The antenna 14 is disposed on or above the plasma processing chamber 10 (i.e., on or above a dielectric window 101). The plasma processing chamber 10 includes the plasma processing space 10s defined by the dielectric window 101, a side wall 102 of the plasma processing chamber 10, and the substrate support 11. The plasma processing chamber 10 includes at least one gas supply port that supplies at least one processing gas to the plasma processing space 10s, and at least one gas discharge port that discharges the gas from the plasma processing space. The plasma processing chamber 10 is grounded.

The substrate support 11 includes the body portion 111 and the ring assembly 112. The body portion 111 includes the central region 111a that supports the substrate W, and the annular region 111b that supports the ring assembly 112. A wafer is an example of the substrate W. The annular region 111b of the body portion 111 surrounds the central region 111a of the body portion 111 viewed in plan view. The substrate W is disposed on the central region 111a of the body portion 111, and the ring assembly 112 is disposed on the annular region 111b of the body portion 111 so as to surround the substrate W on the central region 111a of the body portion 111. Therefore, the central region 111a is referred to as a substrate support surface that supports the substrate W as well, and the annular region 111b is referred to as a ring support surface that supports the ring assembly 112.

In the embodiment, the body portion 111 includes the base 1110 and the electrostatic chuck 1111. The base 1110 includes a conductive member. The conductive member of the base 1110 may function as the bias electrode. The electrostatic chuck 1111 is disposed on the base 1110. The electrostatic chuck 1111 includes the ceramic member 1111a and the electrostatic electrode 1111b disposed inside the ceramic member 1111a. The ceramic member 1111a includes the central region 111a. In the embodiment, the ceramic member 1111a includes the annular region 111b as well. Another member surrounding the electrostatic chuck 1111, such as an annular electrostatic chuck or an annular insulating member, may include the annular region 111b. In this case, the ring assembly 112 may be disposed on either the annular electrostatic chuck or the annular insulating member, or both the electrostatic chuck 1111 and the annular insulating member. Further, at least one RF/DC electrode that is coupled to the radio frequency (RF) power supply 31 and/or the direct current (DC) power supply 32 (to be described later) may be disposed inside the ceramic member 1111a. In this case, at least one RF/DC electrode functions as the bias electrode. The conductive member of the base 1110 and at least one RF/DC electrode may function as a plurality of bias electrodes. Further, the electrostatic electrode 1111b may function as the bias electrode. Therefore, the substrate support 11 includes at least one bias electrode.

The ring assembly 112 includes one or more annular members. In one embodiment, one or more annular members include one or more edge rings and at least one cover ring. The edge ring is made of a conductive material or an insulating material, and the cover ring is made of an insulating material.

Further, the substrate support 11 may include the temperature adjusting module configured to adjust at least one of the electrostatic chuck 1111, the ring assembly 112, and the substrate to a target temperature. The temperature adjusting module may include a heater, a heat transfer medium, the flow path 1110a, or a combination thereof. A heat transfer fluid such as brine or a gas flows through the flow path 1110a. In the embodiment, the flow path 1110a is formed inside the base 1110, and one or more heaters are disposed inside the ceramic member 1111a of the electrostatic chuck 1111. Further, the substrate support 11 may include the heat transfer gas supply unit configured to supply a heat transfer gas to the gap between the rear surface of the substrate W and the central region 111a.

The gas introducing unit is configured to introduce at least one processing gas from the gas supply unit 20 to the plasma processing space 10s. In the embodiment, the gas introducing unit includes a center gas injector (CGI) 131. The center gas injector 131 is disposed above the substrate support 11, and is attached to a central opening formed in the dielectric window 101. The center gas injector 131 includes at least one gas supply port 131a, at least one gas flow path 131b, and at least one gas introducing port 131c. The processing gas supplied to the gas supply port 131a passes through the gas flow path 131b and is introduced from the gas introducing port 131c into the plasma processing space 10s. In addition to or instead of the center gas injector 131, the gas introducing unit may include one or more side gas injectors (SGI) attached to one or more openings formed in the side wall 102.

The gas introducing unit may include a peripheral gas injector 52 as an example of a gas injector. The peripheral gas injector 52 includes a plurality of peripheral injection ports 52i. The plurality of peripheral injection ports 52i supply the gas mainly to an edge portion of the substrate W. The plurality of peripheral injection ports 52i are opened toward the edge portion of the substrate W or an edge portion of the central region 111a that supports the substrate W. The plurality of peripheral injection ports 52i may be disposed at height positions substantially the same as the gas introducing port 131c. Further, the plurality of peripheral injection ports 52i may be disposed along the circumferential direction of the substrate support 11, below the gas introducing port 131c or above the substrate support 11. That is, the plurality of peripheral introduction ports 52i may be arranged annularly around an axis of the gas flow path 131b, in a region where the electron temperature is lower than the region immediately below the dielectric window 101 (plasma diffusion region). In the capacitively coupled plasma processing apparatus 1 illustrated in FIG. 2 as well, the gas introducing unit may include the peripheral gas injector 52 illustrated in FIG. 3.

The gas supply unit 20 may include at least one gas source 21 and at least one flow rate controller 22. In the embodiment, the gas supply unit 20 is configured to supply at least one processing gas from the corresponding gas source 21 to the gas introducing unit via the corresponding flow rate controller 22. Each flow rate controller 22 may include, for example, a mass flow controller or a pressure-control type flow rate controller. Further, the gas supply unit 20 may include one or more flow rate modulation devices that modulate or pulse the flow rate of at least one processing gas.

The power supply 30 includes the RF power supply 31 coupled to the plasma processing chamber 10 via at least one impedance matching circuit. The RF power supply 31 is configured to supply at least one RF signal (RF power) to at least one bias electrode and/or the antenna 14. Therefore, a plasma is formed from at least one processing gas supplied to the plasma processing space 10s. Therefore, the RF power supply 31 may function as at least a part of the plasma generator configured to generate a plasma from one or more processing gases in the plasma processing chamber 10. Further, by supplying the bias RF signal to at least one bias electrode, a bias potential is generated in the substrate W, and an ion component in the formed plasma may be drawn to the substrate W.

In the embodiment, the RF power supply 31 includes the first RF generator 31a and the second RF generator 31b. The first RF generator 31a is configured to be connected to the antenna 14 to generate the source RF signal (source RF power) for plasma generation via at least one impedance matching circuit. In the embodiment, the source RF signal has a frequency within a range of 10 MHz to 150 MHz. In the embodiment, the first RF generator 31a may be configured to generate a plurality of source RF signals having different frequencies. The generated one or more source RF signals are supplied to the antenna 14.

The second RF generator 31b is configured to be coupled to at least one bias electrode via at least one impedance matching circuit to generate the bias RF signal (bias RF power). The frequency of the bias RF signal may be the same as or different from the frequency of the source RF signal. In the embodiment, the bias RF signal has a frequency lower than the frequency of the source RF signal. In the embodiment, the bias RF signal has a frequency within a range of 100 KHz to 60 MHZ. In the embodiment, the second RF generator 31b may be configured to generate a plurality of bias RF signals having different frequencies. The generated one or more bias RF signals are supplied to at least one bias electrode. Further, in various embodiments, at least one of the source RF signal and the bias RF signal may be pulsed.

Further, the power supply 30 may include the DC power supply 32 coupled to the plasma processing chamber 10. The DC power supply 32 includes a bias DC generator 32a. In the embodiment, the bias DC generator 32a is configured to be connected to at least one bias electrode to generate a bias DC signal. The generated bias DC signal is applied to at least one bias electrode.

In various embodiments, the bias DC signal may be pulsed. In this case, the sequence of the voltage pulse is applied to at least one bias electrode. The voltage pulse may have a pulse waveform of rectangular, trapezoidal, triangular, or a combination thereof. In the embodiment, the waveform generator for generating the sequence of the voltage pulse from the DC signal is connected between the bias DC generator 32a and at least one bias electrode. Therefore, the first DC generator 32a and the waveform generator constitute a voltage pulse generator. The voltage pulse may have a positive polarity or a negative polarity. Further, the sequence of the voltage pulse may have one or more positive voltage pulses and one or more negative voltage pulses in one cycle. The bias DC generator 32a may be provided in addition to the RF power supply 31, or may be provided instead of the second RF generator 31b.

The antenna 14 includes one or more coils. In the embodiment, the antenna 14 may include an outer coil and an inner coil disposed coaxially. In this case, the RF power supply 31 may be connected to both the outer coil and the inner coil, or may be connected to any one of the outer coil and the inner coil. In the former case, the same RF generator may be connected to both the outer coil and the inner coil, or separate RF generators may be separately connected to the outer coil and the inner coil.

The exhaust system 40 may be connected to, for example, the gas exhaust port 10e provided in the bottom portion of the plasma processing chamber 10. The exhaust system 40 may include a pressure adjusting valve and a vacuum pump. The pressure in the plasma processing space 10s is adjusted by the pressure adjusting valve. The vacuum pump may include a turbo molecular pump, a dry pump, or a combination thereof.

Example of Substrate W

Figure 4:
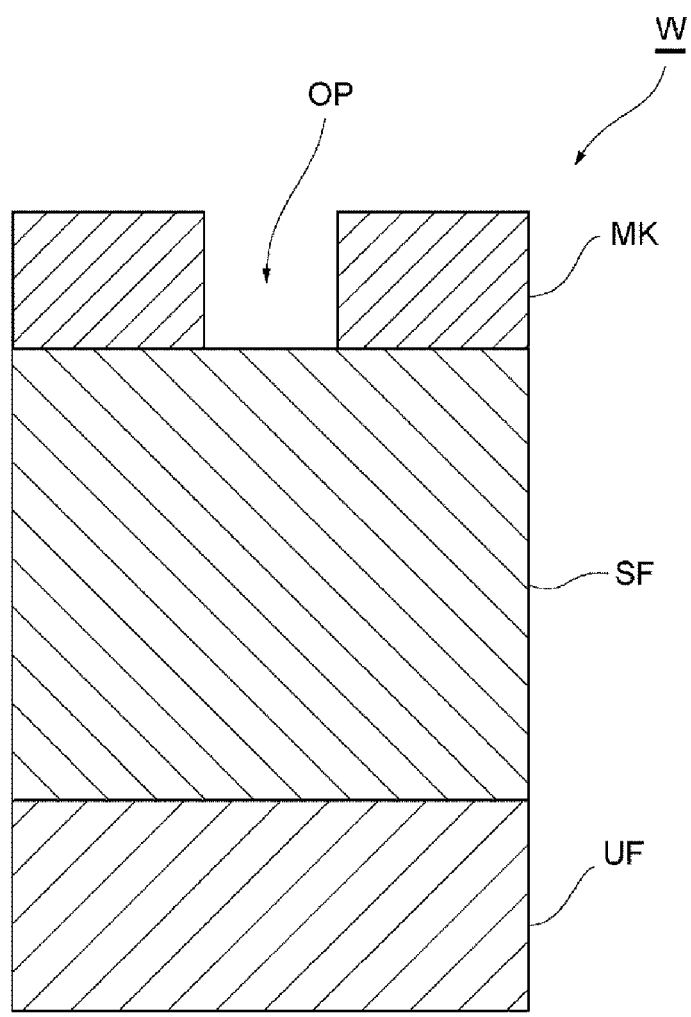
FIG. 4 is a view illustrating an example of a cross-sectional structure of a substrate W.

FIG. 4 is a view illustrating an example of a cross-sectional structure of the substrate W. The substrate W is an example of a substrate to which the present processing method may be applied. The substrate W includes a silicon-containing film SF and a mask film MK. The silicon-containing film SF and the mask film MK are formed on an underlying film UF. As illustrated in FIG. 4, the substrate W may be formed by laminating the underlying film UF, the silicon-containing film SF, and the mask film MK in this order.

The underlying film UF may be an organic film, a dielectric film, a metal film, or a semiconductor film formed on a silicon wafer. Further, the underlying film UF may be the silicon wafer. Further, the underlying film UF may be configured by laminating a plurality of films.

The silicon-containing film SF may be a dielectric film containing silicon Si. The silicon-containing film SF may include a silicon oxide film or a silicon nitride film. As an example, the silicon-containing dielectric film is a SiON film. The silicon-containing film may be a film including other film types as long as the film contains silicon. Further, the silicon-containing film SF may include a silicon film (e.g., polycrystalline silicon film). Further, the silicon-containing film SF may include at least one of a silicon nitride film, a polycrystalline silicon film, a carbon-containing silicon film, and a low dielectric constant film. The carbon-containing silicon film may include a SiC film and/or a SiOC film. The low dielectric constant film may contain silicon so as to be used as an interlayer insulating film. Further, the silicon-containing film SF may include two or more silicon-containing films having film types different from each other. The two or more silicon-containing films may include a silicon oxide film and a silicon nitride film. The silicon-containing film SF may be a multi-layer film including, for example, one or more silicon oxide films and one or more silicon nitride films laminated alternately. The silicon-containing film SF may be a multi-layer film including a plurality of silicon oxide films and a plurality of silicon nitride films laminated alternately. Alternatively, the two or more silicon-containing films may include a silicon oxide film and a silicon film. The silicon-containing film SF may be a multi-layer film including, for example, one or more silicon oxide films and one or more silicon films laminated alternately. The silicon-containing film SF may be a multi-layer film including a plurality of silicon oxide films and a plurality of polycrystalline silicon films laminated alternately. Alternatively, the two or more silicon-containing films may include a silicon oxide film, a silicon nitride film, and a silicon film.

The mask film MK is provided on the silicon-containing film SF. The mask film MK is made of a material having an etching rate lower than an etching rate of the silicon-containing film SF in step ST2. The mask film MK may be made of an organic material. That is, the mask film MK may contain carbon. As an example, a photoresist film may be an EUV photoresist film. The mask film MK may be formed to include, for example, an amorphous carbon film, a photoresist film, or a spin-on carbon film (SOC film). The mask film MK may be formed to include a silicon-containing film such as a silicon-containing anti-reflection film. The mask film MK may be a metal-containing mask made of a metal-containing material such as titanium nitride, tungsten, or tungsten carbide.

The mask film MK is patterned so that at least one opening OP is defined on the silicon-containing film SF. That is, the mask film MK has an opening pattern for etching the silicon-containing film SF in step ST2. Based on the shape of the opening OP defined by the pattern of the mask film MK, a recess such as a hole or a trench is formed in the silicon-containing film SF. An aspect ratio of the opening formed in the silicon-containing film SF in step ST2 may be 20 or more, 30 or more, 40 or more, or 50 or more. The mask film MK may have a line-and-space pattern as the opening pattern.

Example of Processing Method

Figure 5:
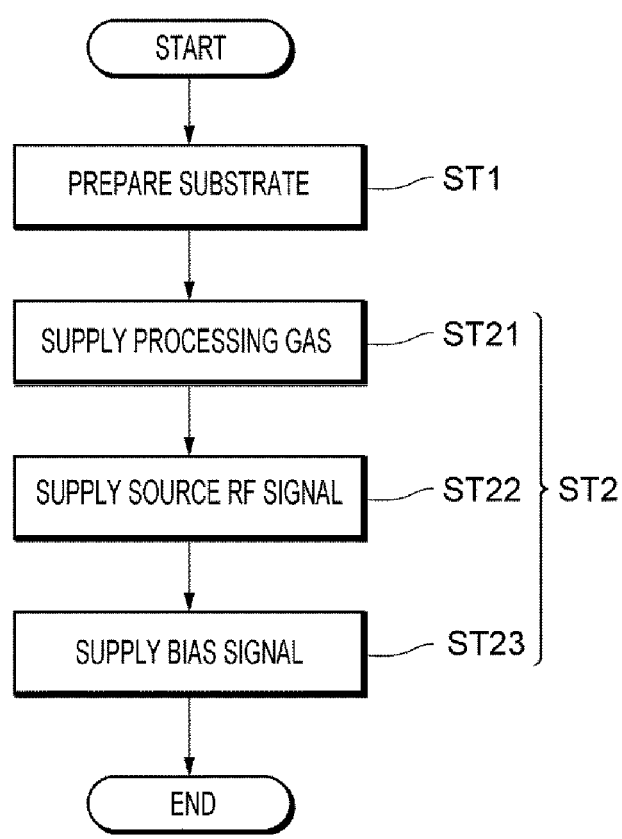
FIG. 5 is a flowchart illustrating an example of a processing method.

FIG. 5 is a flowchart illustrating an example of the present processing method. The present processing method is performed on the substrate W using the plasma processing apparatus 1 illustrated in FIGS. 2 and 3. Hereinafter, descriptions will be made on an example in which the present processing method illustrated in FIG. 5 is performed on the substrate W illustrated in FIG. 4 with reference to each drawing. In the following example, the controller 2 illustrated in FIGS. 1 to 3 controls each component of the plasma processing apparatus 1 illustrated in FIGS. 2 and 3 to perform the present processing method.

(Step ST1: Preparation of Substrate)

In step ST1, the substrate W is prepared in the plasma processing space 10s of the plasma processing chamber 10. In step ST1, the substrate W is disposed on at least the substrate support 11 and is held by the electrostatic chuck 1111. At least a part of a step of forming each component included in the substrate W may be performed in the plasma processing space 10s as a part of step ST1. Further, after all or a part of each component of the substrate W is formed in an apparatus or a chamber outside the plasma processing apparatus 1, the substrate W may be carried into the plasma processing space 10s and disposed on the substrate support 11.

Step ST1 may include a step of setting the temperature of the substrate support 11. In order to set the temperature of the substrate support 11, the controller 2 may control the temperature adjusting module. As an example, the controller 2 may set the temperature of the substrate support 11 to 20° C. or less.

(Step ST2: Performance of Etching)

In step ST2, the silicon-containing film SF of the substrate W is etched. Step ST2 includes a step of supplying the processing gas (step ST21), a step of supplying the source RF signal (source RF power) (step ST22), and a step of supplying the bias signal (step ST23). In step ST2, the silicon-containing film SF is etched by active species (ions and radicals) of the plasma generated from the processing gas. The order in which steps ST21 to ST23 are started is not limited to this order. Further, steps ST21 to ST23 may be executed in parallel.

(Step ST21: Supply of Processing Gas)

In step ST21, the processing gas is supplied into the plasma processing chamber 10. The processing gas is a gas used to etch the etching film formed on the substrate W. The type of the processing gas may be appropriately selected based on the material of the etching film, the material of the mask film, the material of the underlying film, the pattern included in the mask film, and the depth of the etching.

The processing gas used in step ST21 may include a gas containing hydrogen and fluorine. The gas containing hydrogen and fluorine may be a gas that can generate a hydrogen fluorine (HF) species in the plasma processing chamber 10, during the plasma processing. The hydrogen fluorine species functions as an etchant. The gas containing hydrogen and fluorine may be at least one gas species selected from the group consisting of a hydrofluorocarbon. The hydrofluorocarbon may be, for example, at least one of $CH_2F_2$, $CHF_3$, or $CH_3F$. The hydrofluorocarbon may contain two or more carbon atoms, or two or more and six or less carbon atoms. The hydrofluorocarbon may contain two carbon atoms such as, for example, $C_2HF_5$, $C_2H_2F_4$, $C_2H_3F_3$, or $C_2H_4F_2$. The hydrofluorocarbon may contain three or four carbon atoms such as, for example, $C_3HF_7$, $C_3H_2F_2$, $C_3H_2F_4$, $C_3H_2F_6$, $C_3H_3F_5$, $C_4H_2F_6$, $C_4H_5F_5$, or $C_4H_2F_8$. The hydrofluorocarbon gas may contain five carbon atoms such as, for example, $C_5H_2F_6$, $C_5H_2F_{10}$, or $C_5H_3F_7$. In the embodiment, the hydrofluorocarbon gas contains at least one selected from the group consisting of $C_3H_2F_4$, $C_3H_2F_6$, $C_4H_2F_6$, and $C_4H_2F_8$. The processing gas may contain the hydrogen fluorine (HF) as a gas that can generate a hydrogen fluorine (HF) species in the plasma processing chamber 10, during the plasma processing. The ratio of the number of hydrogen atoms to the number of fluorine atoms may be 0.2 or more, 0.25 or more, or 0.3 or more.

Further, the gas containing hydrogen and fluorine may be a mixed gas that can generate a hydrogen fluorine species in the plasma processing chamber 10, during the plasma processing. The mixed gas that can generate the hydrogen fluorine species may contain a hydrogen source and a fluorine source. The hydrogen source may be, for example, $H_2$, $NH_3$, $H_2O$, $H_2O_2$, or hydrocarbon (e.g., $CH_4$ or $C_3H_6$). The fluorine source may be $BF_3$, $NF_3$, $PF_3$, $PF_5$, $SF_6$, $WF_6$, $XeF_2$, or fluorocarbon. As an example, the mixed gas that can generate the hydrogen fluorine species is a mixed gas of nitrogen trifluoride ($NF_3$) and hydrogen ($H_2$).

The processing gas used in step ST21 may further include at least one phosphorus-containing molecule. The phosphorus-containing molecule may be an oxide such as tetraphosphorus decaoxide ($P_4O_{10}$), tetraphosphorus octaoxide ($P_4O_8$), or tetraphosphorus hexaoxide ($P_4O_6$). Tetraphosphorus decaoxide may be referred to as diphosphorus pentoxide ($P_2O_5$). The phosphorus-containing molecule may be a halide (phosphorus halide) such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), or phosphorus iodide ($PI_3$). That is, the molecule containing phosphorus may be a fluoride (phosphorus fluoride) containing fluorine as a halogen element. Alternately, the molecule containing phosphorus may contain a halogen element other than fluorine as a halogen element. The phosphorus-containing molecule may be a phosphoryl halide such as phosphoryl fluoride ($POF_3$), phosphoryl chloride ($POCl_3$), or phosphoryl bromide ($POBr_3$). The phosphorus-containing molecule may be phosphine ($PH_3$), calcium phosphide (e.g., $Ca_3P_2$), phosphoric acid ($H_3PO_4$), sodium phosphate ($Na_3PO_4$), or hexafluorophosphoric acid ($HPF_6$). The phosphorus-containing molecule may be fluorophosphines (HxPFy). Here, the sum of x and y is 3 or 5. Examples of the fluorophosphines include $HPF_2$ and $H_2PF_3$. The processing gas may contain one or more of the phosphorus-containing molecules described above as at least one phosphorus-containing molecule. For example, the processing gas may contain at least one of $PF_3$, $PCl_3$, $PF_5$, $PCl_5$, $POCl_3$, $PH_3$, $PBr_3$, or $PBr_5$ as at least one phosphorus-containing molecule. When each phosphorus-containing molecule contained in the processing gas is liquid or solid, each phosphorus-containing molecule may be vaporized by, for example, heating, and supplied into the plasma processing chamber 10.

The processing gas used in step ST21 may further contain carbon. A molecule containing carbon may contain at least one carbon-containing gas species selected from the group consisting of hydrocarbons ($C_xH_y$) and fluorocarbons ($C_vF_w$). Here, each of x, t, v, and w is a natural number. Hydrocarbon may contain, for example, $CH_4$, $C_2H_6$, $C_3H_6$, $C_3H_8$, or $C_4H_{10}$. Fluorocarbon may contain, for example, $CF_4$, $C_2F_2$, $C_2F_4$, $C_3F_8$, $C_4F_6$, $C_4F_8$, or $C_5F_8$. The chemical species generated from these carbon-containing gases protects the mask film MK.

Further, the processing gas may contain a halogen-containing molecule. The halogen-containing molecule may not contain carbon. The halogen-containing molecule may be a fluorine-containing molecule, or a halogen-containing molecule containing a halogen element other than fluorine. The fluorine-containing molecule may contain, for example, gases such as nitrogen trifluoride ($NF_3$), sulfur hexafluoride ($SF_6$), or boron trifluoride ($BF_3$). The halogen-containing molecule containing a halogen element other than fluorine may be, for example, at least one selected from the group consisting of a chlorine-containing gas, a bromine-containing gas, and an iodine-containing gas. The chlorine-containing gas is, for example, a gas such as chlorine ($Cl_2$), hydrogen chloride (HCl), silicon dichloride ($SiCl_2$), silicon tetrachloride ($SiCl_4$), carbon tetrachloride ($CCl_4$), dicyclosilane ($SiH_2Cl_2$), disilicon hexachloride ($Si_2Cl_6$), chloroform ($CHCl_3$), sulfuryl chloride ($SO_2Cl_2$), or boron trichloride ($BCl_3$). The bromine-containing gas is, for example, a gas such as bromine ($Br_2$), hydrogen bromide (HBr), dibromodifluoromethane ($CBr_2F_2$), bromopentafluoroethane ($C_2F_5Br$), phosphorus tribromide ($PBr_3$), phosphorus pentabromide ($PBr_5$), oxybromide phosphate ($POBr_3$), or boron tribromide (BBr3). An iodine-containing gas is, for example, a gas such as hydrogen iodide (HI), trifluoroiodomethane ($CF_3I$), pentafluoroiodoethane ($C_2F_5I$), heptafluoropropyl iodide ($C_3F_7I$), iodine pentafluoride ($IF_5$), iodine heptafluoride ($IF_7$), iodine ($I_2$), or phosphorus triiodide ($PI_3$). The chemical species generated from these halogen-containing molecules is used to control the shape of the recess formed by plasma etching.

The processing gas may further contain an oxygen-containing molecule. The oxygen-containing molecule may contain, for example, $O_2$, $CO_2$, or CO. Further, the processing gas may contain a noble gas such as Ar, Kr, or Xe.

The processing gas supplied into the plasma processing chamber 10 may contain one or more gases. The one or more gases may contain hydrogen, carbon, and fluorine. In this case, each of the one or more gases may contain hydrogen, carbon, and fluorine. Further, when the one or more gases are a plurality of gases, one of the plurality of gases contains one or more of hydrogen, carbon, and fluorine, and some or all of the one or more gases of the plurality of gases may contain the remainder of hydrogen, carbon, and fluorine.

Further, in the plasma processing apparatus 1 in FIG. 3, the processing gas may be supplied from one of or both the center gas injector 131 and side gas injector into the plasma processing chamber 10. As an example, the flow rate of the carbon-containing gas supplied from the side gas injector may be larger than the flow rate of the carbon-containing gas supplied from the center gas injector 131. That is, with respect to the flow rate of the carbon-containing gas contained in the processing gas, the ratio of the flow rate of the carbon-containing gas supplied from the center gas injector 131 may be 50% or less, and the ratio of the flow rate of the carbon-containing gas supplied from the side gas injector may be 50% or more. Further, with respect to the flow rate of the carbon-containing gas contained in the processing gas, the ratio of the flow rate of the carbon-containing gas supplied from the center gas injector 131 may be 20% or less, and the ratio of the flow rate of the carbon-containing gas supplied from the side gas injector may be 80% or more. Further, with respect to the flow rate of the carbon-containing gas contained in the processing gas, the ratio of the flow rate of the carbon-containing gas supplied from the center gas injector 131 may be 10% or less, and the ratio of the flow rate of the carbon-containing gas supplied from the side gas injector may be 90% or more. Further, with respect to the flow rate of the carbon-containing gas contained in the processing gas, the ratio of the flow rate of the carbon-containing gas supplied from the center gas injector 131 may be 5% or less, and the ratio of the flow rate of the carbon-containing gas supplied from the side gas injector may be 95% or more. Further, the ratio of the flow rate of the carbon-containing gas supplied from the side gas injector in the flow rate of the carbon-containing gas contained in the processing gas may be 100%. Further, similarly, in the plasma processing apparatus 1 in FIG. 2, the processing gas may be supplied from one of or both the shower head 13 and side gas injector into the plasma processing chamber 10.

Further, as an example, in the processing gas supplied into the plasma processing chamber 10, the number of the carbon atoms contained in the carbon-containing gas supplied from the center gas injector 131 may be larger than the number of the carbon atoms contained in the carbon-containing gas supplied from the side gas injector.

By supplying at least a part of the carbon-containing gas contained in the processing gas from the side gas injector into the plasma processing chamber 10, it is possible to improve the uniformity of the etching rate of the etching film and/or the dimensional uniformity of the recess formed in the etching film, within the plane of the substrate W.

(Step ST22: Supply of Source RF Signal)

In step ST22, the source RF signal is supplied. As an example, the source RF signal may be supplied to the upper electrode of the plasma processing apparatus 1 in FIG. 2 or to the antenna 14 of the plasma processing apparatus 1 in FIG. 3. The upper electrode and the antenna 14 are examples of the plasma generator. The source RF signal may be a continuous wave, or a pulse wave.

The power of the source RF signal is larger than the power of the bias signal supplied in step ST23 (to be described later). As an example, the power of the source RF signal may be 300 W or more. Further, the power of the source RF signal may be 500 W or more, 1,000 W or more, or 2,000 W or more.

(Step ST23: Supply of Bias Signal)

In step ST23, the bias signal is supplied. As an example, the bias signal is supplied to the substrate support 11 in FIGS. 2 and 3. The bias signal may be supplied to a member that can function as the bias electrode in the substrate support 11.

The power of the bias signal is smaller than the power of the source RF signal. As an example, the power of the bias signal may be 200 W or less. Further, the power of the bias signal may be 100 W or less or 50 W or less. As an example, the power of the bias signal may be larger than the power of the source RF signal.

In step ST2, the pressure inside the plasma processing chamber 10 may be appropriately set. As an example, the pressure inside the plasma processing chamber 10 may be set at 50 mTorr or less, 30 mTorr or less, or 10 mTorr or less.

Figure 6:
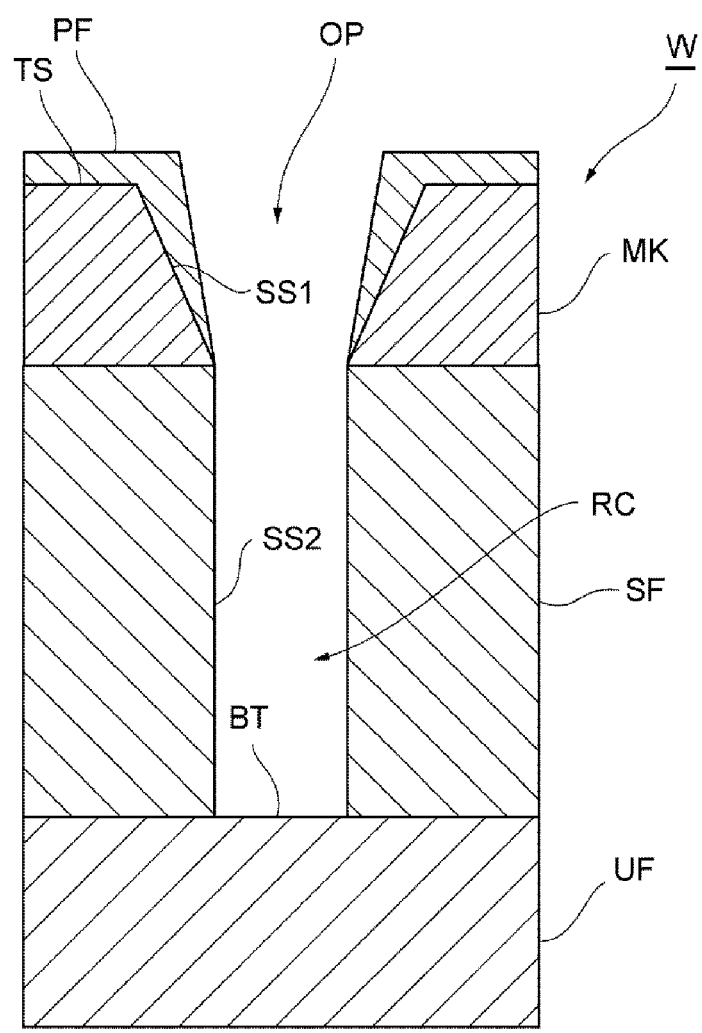
FIG. 6 is a view illustrating an example of a cross-sectional structure of the substrate W.

FIG. 6 is a view illustrating an example of a cross-sectional structure of the substrate W on which the etching is performed in step ST2. When the processing gas is supplied into the plasma processing chamber 10 in step ST21, and the source RF signal is supplied in step ST22, a plasma is generated in the plasma processing space 10s. Then, the chemical species such as ions or radicals in the generated plasma is drawn to the substrate W, so that the silicon-containing film SF is etched. As an example, the chemical species is a hydrogen fluoride species. Then, as illustrated in FIG. 6, based on the shape of the opening OP of the mask film MK, a recess RC defined by a side wall SS2 of the silicon-containing film SF is formed in the silicon-containing film SF as well in succession from the opening OP formed in the mask film MK. The recess RC may be an opening that exposes the underlying film UF at the bottom portion BT thereof.

Further, a part of the mask film MK may be etched by the chemical species such as ions or radicals in the generated plasma. As an example, the chemical species is a hydrogen fluoride species. Meanwhile, a protective film PF may be formed on at least a part of the mask film MK by the chemical species in the plasma. As an example, the protective film PF may be a carbon-containing film formed by containing carbon in the processing gas. The protective film PF may be formed on at least a part of an upper surface TS and/or a side wall SS1 of the surface of the mask film MK. Further, the protective film PF may be formed from the side wall SS1 of the mask film MK to a part of the side wall SS2 that defines the recess of the silicon-containing film SF.

Example of Processing Method

The silicon-containing film SF of the substrate W is etched under conditions of Reference Example 1, Example 1, and Example 2 below. "H/F" is a ratio of the number of hydrogen atoms to the number of fluorine atoms contained in the processing gas.

Reference Example 1

Apparatus: CCP plasma processing apparatus
Source RF Signal: 60 MHz, 500 W
Bias RF signal: 40 MHz, 400 W
Processing gas: $CHF_3$, $CF_4$
H/F: 0.09

Example 1

Apparatus: CCP plasma processing apparatus (FIG. 2)
Source RF Signal: 60 MHz, 1,000 W
Bias RF signal: 40 MHz, 50 W
Processing gas: $CHF_3$, $H_2$, $NF_3$, $N_2$
H/F: 0.33

Example 2

Apparatus: ICP plasma processing apparatus (FIG. 3)
Source RF Signal: 27 MHz, 2,000 W
Bias RF signal: 13 MHz, 80 W
Processing gas: $CH_3F$, $CHF_3$, $NF_3$, $N_2$, Ar
H/F: 0.42

Figures 7A, 7B, 7C, 8:
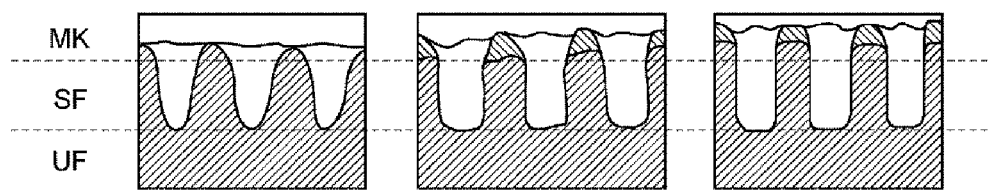
FIGS. 7A to 7C are views illustrating examples of a cross-sectional structure of the substrate W.
FIG. 8 is a table illustrating measurement results of Reference Example 1, Example 1, and Example 2.

FIGS. 7A to 7C are views illustrating cross sections of the substrate W after etching the silicon-containing film SF. FIGS. 7A to 7C illustrate a cross-sectional view of the substrate W after etching the silicon-containing film SF under the conditions of Reference Example 1, Example 1, and Example 2, respectively.

First, the mask film MK is etched in FIG. 7A illustrating Reference Example 1, while the mask film MK remains sufficiently even after etching the silicon-containing film SF in FIG. 7B illustrating Example 1 and FIG. 7C illustrating Example 2. Specifically, the thickness of the mask film MK is 31 nm before the silicon-containing film SF is etched in all of Reference Example 1, Example 1, and Example 2. Meanwhile, after etching the silicon-containing film SF, the thickness of the mask film MK is 8.0 nm in Reference Example 1, 18 nm in Example 1, and 23 nm in Example 2. The thickness of the mask film MK includes the thickness of the protective film PF formed on the surface of the mask film MK.

Further, the cross-sectional shape of the recess RC is tapered in FIG. 7A illustrating Reference Example 1, while the cross-sectional shape of the recess RC is substantially vertical in FIG. 7B illustrating Example 1 and in FIG. 7C illustrating Example 2. Specifically, the ratio of an opening width at the lower end of the recess RC to an opening width at the upper end of the recess RC is 0.45 in Reference Example 1. Meanwhile, the ratio is 0.89 in Example 1 and 0.94 in Example 2.

FIG. 8 is a table illustrating measurement results of a critical dimension (CD) of the recess RC, local critical dimension uniformity (LCDU: 3σ of CD), and circle edge roughness (CER) of Reference Example 1, Example 1, and Example 2. In the table, the CD is an average value. Further, in each of Reference Example 1, Example 1, and Example 2, the shape of the opening is a circular shape when viewed in plan view of the recess RC, and the CER indicates roughness of the opening.

As illustrated in FIG. 8, better results are obtained in Example 1 and Example 2 than Reference Example 1. That is, first, the LCDU of the recess RC in Example 1 and Example 2 is largely improved compared with the LCDU in Reference Example 1. That is, in Examples 1 and 2, the uniformity of the opening width of the recess RC may be largely improved. Further, with respect to the CER, Example 1 and Example 2 have a smaller value than Reference Example 1. That is, in Example 1 and Example 2, it is possible to obtain an opening shape closer to a perfect circle than an opening shape in Reference Example 1.

Figure 9:
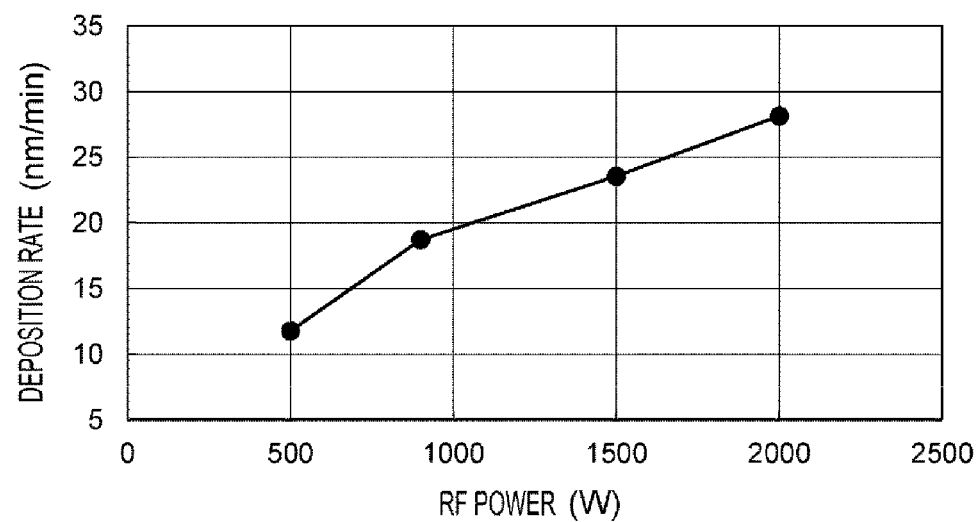
FIG. 9 is a graph illustrating a change in a deposition rate of a carbon-containing film (protective film PF).

FIG. 9 is a graph illustrating a change in a deposition rate of the carbon-containing film (protective film PF) in Example 2. That is, the graph in FIG. 9 illustrates a measurement result obtained by measuring the change in the deposition rate of the carbon-containing film by setting the power of the bias RF signal to 0 W and changing the power of the source RF signal (RF power) in the conditions of Example 2. As illustrated in FIG. 9, it is confirmed that, when the power of the source RF signal is increased, the deposition rate of the carbon-containing film is significantly increased as well.

Figure 10:
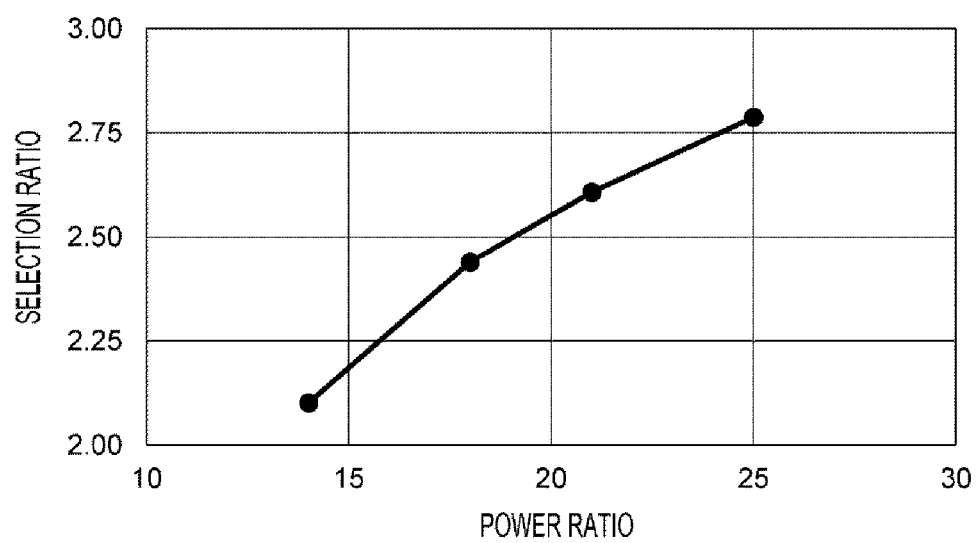
FIG. 10 is a graph illustrating a change in a selection ratio of a silicon-containing film SF to a mask film MK.

FIG. 10 is a graph illustrating a change in a selection ratio of the silicon-containing film SF to the mask film MK in Example 2. In FIG. 10, a lateral axis indicates a ratio of the power (power ratio) of the source RF signal to the power of the bias RF signal. That is, the graph in FIG. 10 illustrates the result of the calculation of the ratio (selection ratio) of the etching rate of the silicon-containing film SF to the mask film MK by changing the power of the source RF signal to the power of the bias signal in the conditions of Example 2. As illustrated in FIG. 10, when the power ratio is increased, the selection ratio is significantly increased as well.

In the present processing method, it is possible to generate a plasma containing large amount of active species of hydrogen fluoride and having a relatively high electron density. Therefore, it is possible to form the recess RC having a relatively high selection ratio and having a cross-sectional shape close to the vertical shape in the etching of the silicon-containing film SF. Further, in the present processing method, it is possible to supply the source RF signal having the power larger than the power of the bias signal to the upper electrode or the antenna, and to use the gas containing a hydrofluorocarbon gas as the processing gas. Therefore, it is possible to further improve the selection ratio and the vertical shape in the etching of the silicon-containing film SF.

Further, the silicon-containing film SF of the substrate W is etched under conditions of Reference Example 2 and Example 3 below. The mask film MK is an amorphous carbon film in Reference Example 2 and Example 3.

Reference Example 2

Apparatus: CCP plasma processing apparatus
Source RF Signal: 40 MHz, 0 W
Bias RF signal: 13.56 MHz, 450 W
Processing gas: $C_4F_6$, $O_2$, Ar Example 3

Figure 11:
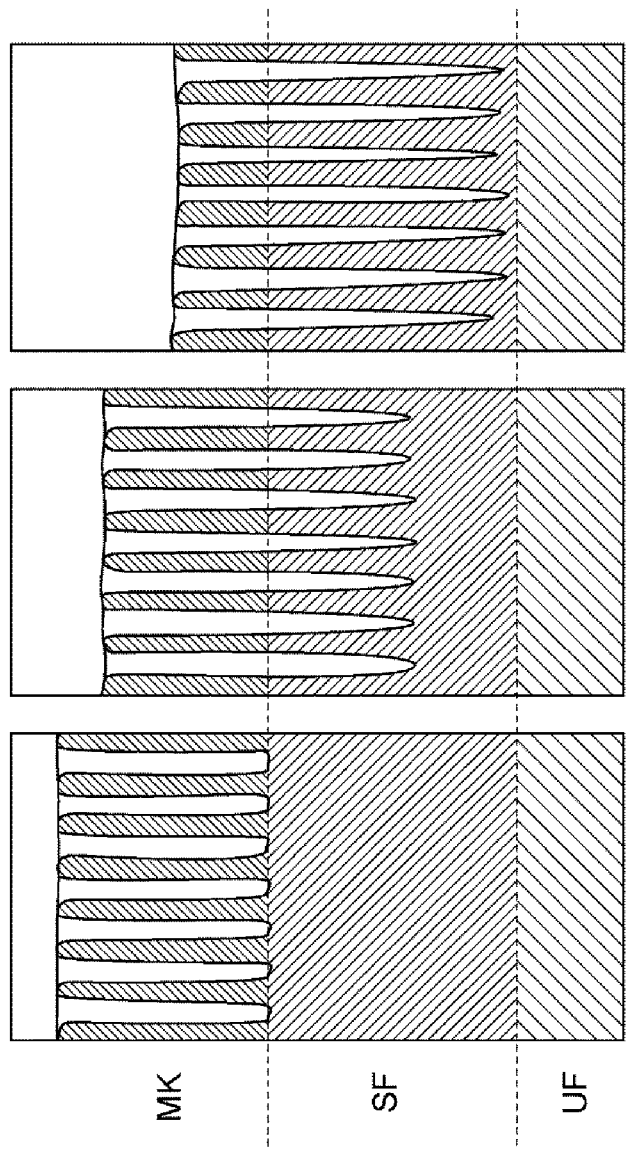
FIGS. 11A to 11C are views illustrating examples of a cross-sectional structure of the substrate W.

Apparatus: ICP plasma processing apparatus (FIG. 3)
Source RF Signal: 27 MHz, 500 W
Bias RF signal: 13.56 MHz, 450 W
Processing gas: $CHF_3$, $CH_3F$, $NF_3$, $N_2$, $O_2$, $C_4F_6$ FIGS. 11A to 11C are views illustrating cross sections of the substrate W after etching the silicon-containing film SF. FIG. 11A illustrates the cross section of the substrate W before being etched, FIG. 11B illustrates the cross-sectional view of the substrate W after etching the silicon-containing film SF under the conditions of Reference Example 2, and FIG. 11C illustrates the cross-sectional view of the substrate W after etching the silicon-containing film SF under the conditions of Example 3.

FIG. 12 is a table illustrating measurement results of the etching rate, selection ratio, neck CD, and bow CD of the recess RC in Reference Example 2 and Example 3. The selection ratio is a ratio of the etching rate of the mask film MK to the etching rate of the silicon-containing film SF. Further, the neck CD is a dimension (opening width) at the upper end of the recess RC. Further, the bow CD is a dimension (opening width) of the recess RC at the portion of the recess RC where the dimension is largest.

As illustrated in FIGS. 11A to 11C and FIG. 12, better results are obtained in Example 3 than Reference Example 2. That is, first, in Example 3, it is possible to largely improve the etching rate of the silicon-containing film SF while maintaining a sufficient selection ratio. Further, in Example 3, it is possible to suppress the bow CD from expanding while maintaining a sufficient neck CD. As described above, in Example 3, it is possible to increase the verticality of the recess RC while suppressing clogging (blockage) in the neck of the recess RC. The same results as in Example 3 may be obtained in a case where the mask film MK is a metal-containing mask as well.

The present disclosure may include the following aspects.

(Appendix 1)

A plasma processing method performed in a plasma processing apparatus,
  in which the plasma processing apparatus includes a chamber, a substrate support disposed in the chamber, and a plasma generator disposed to face the substrate support, and
  the plasma processing method includes:
    preparing a substrate including a silicon-containing film and a mask film having an opening pattern, on the substrate support; and
    etching the silicon-containing film using the mask film as a mask, with a plasma generated in the chamber,
  the etching includes:
    supplying a processing gas containing one or more gases including carbon, hydrogen, and fluorine into the chamber;
    generating a plasma from the processing gas by supplying a source RF signal to the plasma generator; and
    supplying a bias RF signal to the substrate support, and
  in which, in the etching, the silicon-containing film is etched by at least hydrogen fluoride generated from the processing gas, while forming a carbon-containing film on at least a part of a surface of the mask film.

(Appendix 2)

The plasma processing method according to Appendix 1, in which the plasma processing apparatus is a capacitively coupled plasma processing apparatus using the plasma generator and the substrate support as electrodes.

(Appendix 3)

The plasma processing method according to Appendix 1, in which the plasma processing apparatus is an inductively-coupled plasma processing apparatus.

(Appendix 4)

The plasma processing method according to Appendix 3, in which the plasma generator includes an antenna disposed to face the substrate support,
   in which the chamber includes:
      a side wall; and
      a dielectric window disposed between the substrate support and the antenna,
   the plasma processing apparatus includes:
      a first gas injector disposed in the dielectric window; and
      a second gas injector disposed in the side wall, and
   in which, in the etching, the processing gas is supplied from the first gas injector and second gas injector into the chamber.

(Appendix 5)

The plasma processing method according to any one of Appendices 1 to 3, in which the processing gas contains a nitrogen-containing gas.

(Appendix 6)

The plasma processing method according to Appendix 5, in which the nitrogen-containing gas is nitrogen gas ($N_2$) or nitrogen trifluoride ($NF_3$).

(Appendix 7)

The plasma processing method according to any one of Appendices 1 to 6, in which, in the processing gas, a ratio of a number of hydrogen atoms to a number of fluorine atoms is 0.2 or more.

(Appendix 8)

The plasma processing method according to any one of Appendices 1 to 7, in which, in the etching, a pressure in the chamber is 50 mTorr or less.

(Appendix 9)

The plasma processing method according to any one of Appendices 1 to 8, in which a power of the source RF signal is larger than a power of the bias signal.

(Appendix 10)

The plasma processing method according to any one of Appendices 1 to 9, in which a ratio of the power of the source RF signal to the power of the bias signal is 10 or more.

(Appendix 11)

The plasma processing method according to any one of Appendices 1 to 10, in which the preparing includes:
   forming an EUV resist on the silicon-containing film;
   forming the mask film having the opening pattern by exposing the EUV resist; and
   disposing the substrate on which the mask film is formed, on the substrate support.

(Appendix 12)

The plasma processing method according to Appendix 11, in which the EUV resist is an organic resist.

(Appendix 13)

The plasma processing method according to Appendix 11, in which the EUV resist is a metal-containing film resist.

(Appendix 14)

The plasma processing method according to Appendix 13, in which the metal-containing film resist is a tin (Sn)-containing film resist.

(Appendix 15)

The plasma processing method according to any one of Appendices 1 to 14, in which the power of the source RF signal is 500 W or more.

(Appendix 16)

The plasma processing method according to any one of Appendices 1 to 15, in which the power of the bias RF signal is 200 W or less.

(Appendix 17)

The plasma processing method according to any one of Appendices 1 to 3, in which the mask film is a carbon-containing film or a metal-containing film.

(Appendix 18)

The plasma processing method according to Appendix 17, in which the power of the source RF signal is 500 W or more.

(Appendix 19)

The plasma processing method according to Appendix 17 or 18, in which the power of the bias RF signal is 200 W or more.

(Appendix 20)

The plasma processing method according to any one of Appendices 17 to 19, in which an opening width of an opening included in the opening pattern is 25 nm or less.

(Appendix 21)

A plasma processing apparatus including:
   a chamber;
   a substrate support disposed in the chamber;
   a plasma generator provided to face the substrate support; and
   a controller,
   in which the controller performs:
      control of preparing of a substrate including a silicon-containing film and a mask film on the substrate support; and
      control of etching of the silicon-containing film using the mask film as a mask, with a plasma generated in the chamber, in the control of etching,
      control of supplying a processing gas containing one or more gases including carbon, hydrogen, and fluorine into the chamber;
      control of generating a plasma from the processing gas by supplying a source RF signal to the plasma generator; and
      control of supplying a bias RF signal to the substrate support are performed, and
   in the control of etching, control of etching of the silicon-containing film by at least hydrogen fluoride generated from the processing gas while forming a carbon-containing film on at least a part of a surface of the mask film is performed.

According to one embodiment of the present disclosure, it is possible to provide the plasma processing method and the plasma processing apparatus capable of performing etching with relatively high verticality.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
   providing a substrate including a silicon-containing film and a mask film having an opening pattern, on a substrate support in a chamber of a plasma processing apparatus; and
   etching the silicon-containing film using the mask film as a mask, with a plasma generated by a plasma generator provided in the chamber to face the substrate support, wherein the etching includes:
   supplying a processing gas containing one or more gases including carbon, hydrogen, and fluorine into the chamber;
   generating a plasma from the processing gas by supplying a source RF signal to the plasma generator; and
   supplying a bias signal to the substrate support, and
   wherein, in the etching, the silicon-containing film is etched by at least hydrogen fluoride generated from the processing gas, while forming a carbon-containing film on at least a part of a surface of the mask film.

2. The plasma processing method according to claim 1, wherein the plasma processing apparatus is a capacitively-coupled plasma processing apparatus using the plasma generator and the substrate support as an upper electrode and a lower electrode, respectively.

3. The plasma processing method according to claim 1, wherein the plasma processing apparatus is an inductively-coupled plasma processing apparatus.

4. The plasma processing method according to claim 3, wherein the plasma generator includes an antenna disposed to face the substrate support, wherein the chamber includes:
   a side wall; and
   a dielectric window disposed between the substrate support and the antenna,
   wherein the plasma processing apparatus includes:
   a first gas injector disposed in the dielectric window; and
   a second gas injector disposed in the side wall, and
   wherein, in the etching, the processing gas is supplied from the first gas injector and second gas injector into the chamber.

5. The plasma processing method according to claim 1, wherein the processing gas contains a nitrogen-containing gas.

6. The plasma processing method according to claim 5, wherein the nitrogen-containing gas is nitrogen gas ($N_2$) or nitrogen trifluoride ($NF_3$).

7. The plasma processing method according to claim 1, wherein, in the processing gas, a ratio of a number of hydrogen atoms to a number of fluorine atoms is 0.2 or more.

8. The plasma processing method according to claim 1, wherein, in the etching, a pressure in the chamber is 50 mTorr or less.

9. The plasma processing method according to claim 1, wherein a power of the source RF signal is larger than a power of the bias signal.

10. The plasma processing method according to claim 1, wherein a ratio of the power of the source RF signal to the power of the bias signal is 10 or more.

11. The plasma processing method according to claim 1, wherein the power of the source RF signal is 500 W or more.

12. The plasma processing method according to claim 1, wherein the power of the bias signal is 200 W or less.

13. The plasma processing method according to claim 1, wherein an opening width of an opening included in the opening pattern is 25 nm or less.

14. A plasma processing method comprising:
   providing a substrate including a silicon-containing film and a mask film having an opening pattern, on a substrate support in a chamber of a plasma processing apparatus; and
   etching the silicon-containing film using the mask film as a mask, with a plasma generated by a plasma generator provided in the chamber to face the substrate support, wherein the etching includes:
   supplying a processing gas containing one or more gases including carbon, hydrogen, and fluorine into the chamber;
   generating a plasma from the processing gas by supplying a source RF signal to the plasma generator; and
   supplying a bias signal to the substrate support, and
   wherein, in the etching, the silicon-containing film is etched by at least hydrogen fluoride generated from the processing gas, while forming a carbon-containing film on at least a part of a surface of the mask film, and
   wherein, the providing further includes:
   forming an EUV resist on the silicon-containing film;
   exposing the EUV resist thereby forming the mask film having the opening pattern; and
   disposing the substrate on which the mask film is formed, on the substrate support.

15. The plasma processing method according to claim 14, wherein the EUV resist is an organic film resist.

16. The plasma processing method according to claim 14, wherein the EUV resist is a metal-containing film resist.

17. The plasma processing method according to claim 16, wherein the metal-containing film resist is a tin (Sn)-containing film resist.

18. A plasma processing apparatus comprising:
   a processing chamber configured to perform a plasma processing;
   a substrate support disposed in the processing chamber and configured to dispose a substrate;
   a plasma generator provided in the processing chamber to face the substrate support; and
   a controller,
   wherein the controller is configured to perform:
   providing the substrate including a silicon-containing film and a mask film having an opening pattern, on the substrate support, and
   etching the silicon-containing film using the mask film as a mask, with plasma generated by the plasma generator,
   wherein the etching includes:
   supplying a processing gas containing one or more gases including carbon, hydrogen, and fluorine into the processing chamber;
   generating plasma from the processing gas by supplying a source RF signal to the plasma generator; and
   supplying a bias signal to the substrate support, and
   wherein, in the etching, the silicon-containing film is etched by at least hydrogen fluoride generated from the processing gas, while forming a carbon-containing film on at least a part of a surface of the mask film.

* * * * *